United States Patent
French (10) Patent No.: US 12,488,938 B2
(45) Date of Patent: Dec. 2, 2025

(54) VARIABLE INDUCTOR DEVICE COMPRISING FIRST AND SECOND PLANAR LOOPS CONFIGURED TO BE SEPARABLE BY PIVOTING ABOUT A HINGE

(71) Applicant: Lam Research Corporation, Fremont, CA (US)

(72) Inventor: David Michael French, Fort Myers, FL (US)

(73) Assignee: Lam Research Corporation, Fremont, CA (US)

( * ) Notice: Subject to any disclaimer, the term of this patent is extended or adjusted under 35 U.S.C. 154(b) by 1001 days.

(21) Appl. No.: 17/615,380

(22) PCT Filed: May 5, 2020

(86) PCT No.: PCT/US2020/031518
§ 371 (c)(1),
(2) Date: Nov. 30, 2021

(87) PCT Pub. No.: WO2020/247135
PCT Pub. Date: Dec. 10, 2020

(65) Prior Publication Data
US 2022/0230802 A1    Jul. 21, 2022

Related U.S. Application Data

(60) Provisional application No. 62/858,568, filed on Jun. 7, 2019.

(51) Int. Cl.
*H01F 29/12* (2006.01)
*H01J 37/32* (2006.01)
(Continued)

(52) U.S. Cl.
CPC ........ *H01F 29/12* (2013.01); *H01J 37/32183* (2013.01); *H03H 7/0153* (2013.01);
(Continued)

(58) Field of Classification Search
CPC .......... H03H 7/09; H03H 7/12; H03H 7/0153; H03H 7/0161; H01F 29/12
(Continued)

(56) References Cited

U.S. PATENT DOCUMENTS

| | | |
|---|---|---|
| 4,393,157 A | 7/1983 | Roberge et al. |
| 5,426,409 A | 6/1995 | Johnson |

(Continued)

FOREIGN PATENT DOCUMENTS

| | | |
|---|---|---|
| CN | 203192568 | 9/2013 |
| CN | 104733427 | 6/2015 |

(Continued)

OTHER PUBLICATIONS

"Japanese Application Serial No. 2021-572276, Response filed Jun. 28, 2024 to Notification of Reasons for Refusal mailed Jan. 16, 2024", w current English claims, 13 pgs.

(Continued)

*Primary Examiner* — Benny T Lee
(74) *Attorney, Agent, or Firm* — Schwegman Lundberg & Woessner, P.A.

(57) ABSTRACT

In some examples, a variable inductor device includes a first planar loop comprising a first planar face and a material that supports electromagnetic coupling and a second planar loop comprising a second planar face and a material that supports electromagnetic coupling. The first planar loop is separable from the second planar loop to vary the inductance of the variable inductance device. In some examples, the first and second planar faces overlapping each other in a closed configuration of the device.

20 Claims, 8 Drawing Sheets

(51) Int. Cl.
  *H03H 7/01* (2006.01)
  *H03H 7/09* (2006.01)
  *H03H 7/12* (2006.01)
(52) U.S. Cl.
  CPC ............ *H03H 7/0161* (2013.01); *H03H 7/09* (2013.01); *H03H 7/12* (2013.01)
(58) Field of Classification Search
  USPC ....................................................... 333/185
  See application file for complete search history.

(56) References Cited

U.S. PATENT DOCUMENTS

| | | | |
|---|---|---|---|
| 6,114,938 | A | 9/2000 | Iida et al. |
| 6,184,755 | B1 | 2/2001 | Barber et al. |
| 6,317,021 | B1 | 11/2001 | Jansen |
| 6,437,653 | B1 | 8/2002 | Cruz et al. |
| 6,556,416 | B2 | 4/2003 | Kunihiro |
| 6,572,732 | B2 | 6/2003 | Collins |
| 2002/0023718 | A1 | 2/2002 | Choi et al. |
| 2003/0001712 | A1 | 1/2003 | Zou et al. |
| 2005/0068146 | A1 | 3/2005 | Jessie |
| 2007/0182520 | A1 | 8/2007 | Kawakubo et al. |
| 2013/0055879 | A1* | 3/2013 | Clark et al. .......... G10H 1/0091 84/737 |
| 2015/0340147 | A1 | 11/2015 | Pennander |
| 2016/0259872 | A1 | 9/2016 | Howald et al. |
| 2018/0213614 | A1 | 7/2018 | Ignatowski et al. |

FOREIGN PATENT DOCUMENTS

| | | |
|---|---|---|
| CN | 113924693 | 1/2022 |
| JP | S58147107 | 9/1983 |
| JP | H0696957 A | 4/1994 |
| JP | 2001076935 | 3/2001 |
| JP | 2003068571 | 3/2003 |
| JP | 2004304154 | 10/2004 |
| JP | 2007005498 | 1/2007 |
| JP | 2007180345 | 7/2007 |
| JP | 2011009432 A | 1/2011 |
| JP | 2022535129 | 8/2022 |
| JP | 7560492 | 9/2024 |

OTHER PUBLICATIONS

"Chinese Application Serial No. 202080042005.4, Response to Examiner Telephone Interview filed May 29, 2024", w English claims, 4 pgs.
"Chinese Application Serial No. 202080042005.4, Response to Examiner Telephone Interview filed May 11, 2024", 4 pgs.
International Application Serial No. PCT/US2020/031518, International Search Report mailed Aug. 28, 2020, 3 pgs.
International Application Serial No. PCT/US2020/031518, Written Opinion mailed Aug. 28, 2020, 7 pgs.
"Chinese Application Serial No. 202080042005.4, Response filed Jul. 15, 2022 to Office Action mailed Mar. 2, 2022", w English claims, 4 pgs.
"International Application Serial No. PCT US2020 031518, International Preliminary Report on Patentability mailed Dec. 16, 2021", 9 pages.
"Chinese Application Serial No. 202080042005.4, Office Action mailed Mar. 2, 2022", with machine English translation, 26 pages.
"Chinese Application Serial No. 202080042005.4, Office Action mailed Oct. 10, 2022", w English Translation.
"Chinese Application Serial No. 202080042005.4, Response filed Dec. 23, 2022 to Office Action mailed Oct. 10, 2022", w English claims, 4 pgs.
"Chinese Application Serial No. 202080042005.4, Office Action mailed Feb. 27, 2023", w English Translation, 20 pgs.
"Chinese Application Serial No. 202080042005.4, Decision of Rejection mailed Jul. 11, 2023", w English Translation, 21 pgs.
"Chinese Application Serial No. 202080042005.4, Response filed Oct. 26, 2023 to Decision of Rejection mailed Jul. 11, 2023", w current English claims, 4 pgs.
"Japanese Application Serial No. 2021-572276, Notification of Reasons for Refusal mailed Jan. 16, 2024", w English Translation, 14 pgs.
"Singapore Application Serial No. 11202113501V, Written Opinion mailed Mar. 25, 2024", 9 pgs.
"Singapore Application Serial No. 11202113501V, Response filed Aug. 21, 2024 to Written Opinion mailed Mar. 25, 2024", w English claims, 16 pgs.
"Korean Application Serial No. 10-2022-7000597, Notice of Preliminary Rejection mailed Dec. 19, 2024", w English translation, 11 pgs.
"Korean Application Serial No. 10-2022-7000597, Response filed Feb. 19, 2025 to Notice of Preliminary Rejection mailed Dec. 19, 2024", w current English claims, 37 pgs.

* cited by examiner

VARIABLE INDUCTOR DEVICE COMPRISING FIRST AND SECOND PLANAR LOOPS CONFIGURED TO BE SEPARABLE BY PIVOTING ABOUT A HINGE

CLAIM OF PRIORITY

This application is a U.S. National Stage Filing under 35 U.S.C. 371 from International Application No. PCT/US2020/031518, filed on May 5, 2020, and published as WO 2020/247135 A1 on Dec. 10, 2020, which claims the priority benefit to U.S. Patent Application Ser. No. 62/858,568, filed on 7 Jun. 2019, each of which is incorporated by reference herein in its entirety.

FIELD

The present disclosure relates to a variable inductor device and, in some examples, to systems and methods for tuning an impedance matching network in semiconductor manufacturing. Some examples also relate to micromechanical or printed circuit board (PCB) applications and circuits for use therewith.

BACKGROUND

Inductors and variable inductors can be useful circuit elements in a variety of important applications and products. For example, inductors and variable inductors are integral elements of many RF-wireless products. In some other applications, inductors and variable inductors are used for matching and loading RF supply systems in semiconductor manufacturing operations. For example, a plasma system for semiconductor processing typically includes one or more multiple radio frequency (RF) sources, an impedance match, and a plasma reactor. A workpiece (e.g. a wafer) is placed inside a plasma chamber and plasma is generated within the plasma chamber to process the work piece. It is important that the workpiece be processed in a similar or uniform manner. To do so, it is important that the RF sources and the impedance match be tuned.

Several difficulties have impeded the development of tuning systems. Regarding inductors in particular, a performance improvement in one parameter (for example, inductance L, capacitance C, or resistance R) is typically obtained at the expense of the other. In certain high-power applications, vacuum variable capacitors are used as the resistive loss in such capacitors is very low. If a tunable inductor is needed, a vacuum variable capacitor can be used in series with a fixed inductor and operated in a region where the total reactance of the system is positive (inductive). Such a configuration requires an additional circuit element as compared to a variable inductor alone. Also, this configuration results in a direct current (DC) block due to the presence of a series capacitor; therefore, a low frequency signal will be blocked by the capacitor. If low frequency signals are to pass through the circuit, additional circuit elements are needed which can significantly complicate the circuit configuration.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent the work of the presently named inventors is described in this background section, as well as aspects of the description that may not otherwise qualify as prior art at the time of filing, are neither expressly nor impliedly admitted as prior art against the present disclosure.

SUMMARY

The present disclosure relates generally to a variable inductor device. In some embodiments, the device acts as a tunable resonator, or delay line. Some examples of the device include a shorted parallel plate-type transmission line in which an angular spacing between two planes of the transmission line is variable to alter the inductance, capacitance, or impedance of the transmission line. Depending on the frequency of operation and details of a circuit in which the device is to be used, the device can behave as a variable inductor, if the electrical length is between (n−1)/4 and (n)/4 guided wavelengths (where n=1, 3, 5 and so forth) or a capacitor, if the electrical length is between (n−1)/4 and (n)/4 guided wavelengths (where n=2, 4, 6, and so forth).

In some examples, when used as a variable inductor, the transmission line (or device) length is less than ¼ wavelength as this length may minimize resistive loss. Some embodiments can operate at a frequency in the range 25 to 30 MHz with an RF current in the range 15-25 Amps, particularly when used with fan cooling. Some device embodiments have a tunable inductance in the range of 30 to 100 nanoHenry (nH) which represents a tunable range more than three times the base inductance.

In some embodiments, a variable inductor device is provided. An example variable inductor device may include a shorted transmission line, the shorted transmission line having a variable geometry to vary the inductance of the variable inductor device; the variable inductor device connectable to a circuit to act as a variable inductor in the circuit.

In some embodiments, the shorted transmission line includes a parallel plate transmission line.

In some embodiments, the parallel plate transmission line includes at least one flat conductor.

In some embodiments, an example variable inductor device may include a first planar loop comprising a first planar face and a material that supports electromagnetic coupling; a second planar loop comprising a second planar face and a material that supports electromagnetic coupling; the first planar loop separable from the second planar loop to vary the inductance of the variable inductance device; and the first and second planar faces overlapping each other in a closed configuration of the device.

In some embodiments, the first planar loop is separable from the second planar loop by pivoting about a hinge point.

In some embodiments, the first and second planar loops are selectively separable with respect to one another between open and closed positions, the closed position corresponding to the closed configuration of the device, the open position corresponding to a desired inductance value of the variable inductor device.

In some embodiments, the open and closed positions correspond to a separation angle between the first and second planar loops in the range zero (0) to twenty (20) degrees.

In some embodiments, substantially an entirety of the first planar loop overlaps the second planar loop in the closed position.

In some embodiments, substantially an entirety of the first planar loop overlaps substantially an entirety of the second planar loop in the closed position.

In some embodiments, the variable inductor device further comprises a hinge at which one of the first and second planar loops is hinged relative to the variable inductor device, or to the other planar loop.

In some embodiments, the hinge is provided at a termination point of the first and second planar loops.

In some embodiments, the hinge is provided at an RF power terminal of the variable inductor device.

In some embodiments, the closed configuration of the variable inductor device corresponds to a base or minimum inductance value of the variable inductor device.

In some embodiments, an open configuration of the variable inductor device corresponds to a maximum inductance value of the variable inductor device.

In some embodiments, the maximum inductance value is greater than the base or minimum inductance value by a factor of three (3) to seven (7) times greater.

In some embodiments, a variable inductor device includes a first planar loop comprising a first planar face and a material that supports electromagnetic coupling; a second planar loop comprising a second planar face and a material that supports electromagnetic coupling; a hinge; and the first planar loop separable from the second planar loop by pivoting about the hinge to vary the inductance of the variable inductance device.

In some embodiments, the first and second planar faces overlap each other in a closed configuration of the device.

In some embodiments, the first and second planar loops are selectively separable with respect to one another between open and closed positions, the closed position corresponding to the closed configuration of the device, the open position corresponding to a desired inductance value of the variable inductor device.

In some embodiments, the open and closed positions correspond to a separation angle between the first and second planar loops in the range zero (0) to twenty (20) degrees.

In some embodiments, substantially an entirety of the first planar loop overlaps the second planar loop in the closed position.

In some embodiments, substantially an entirety of the first planar loop overlaps substantially an entirety of the second planar loop in the closed position.

In some embodiments, the hinge is provided at a termination point of the first and second planar loops.

In some embodiments, the hinge is provided at an RF power terminal of the variable inductor device.

In some embodiments, a closed configuration of the variable inductor device corresponds to a base or minimum inductance value of the variable inductor device.

In some embodiments, an open configuration of the variable inductor device corresponds to a maximum inductance value of the variable inductor device.

In some embodiments, the maximum inductance value is greater than the base or minimum inductance value by a factor of three (3) to seven (7) times greater.

In some embodiments, the variable inductor device further comprises an actuator to move at least one of the first and second planar loops.

BRIEF DESCRIPTION OF THE DRAWINGS

Some embodiments are illustrated by way of example and not limitation in the views of the accompanying drawing.

DESCRIPTION

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2019-2020, All Rights Reserved.

Figure 1:
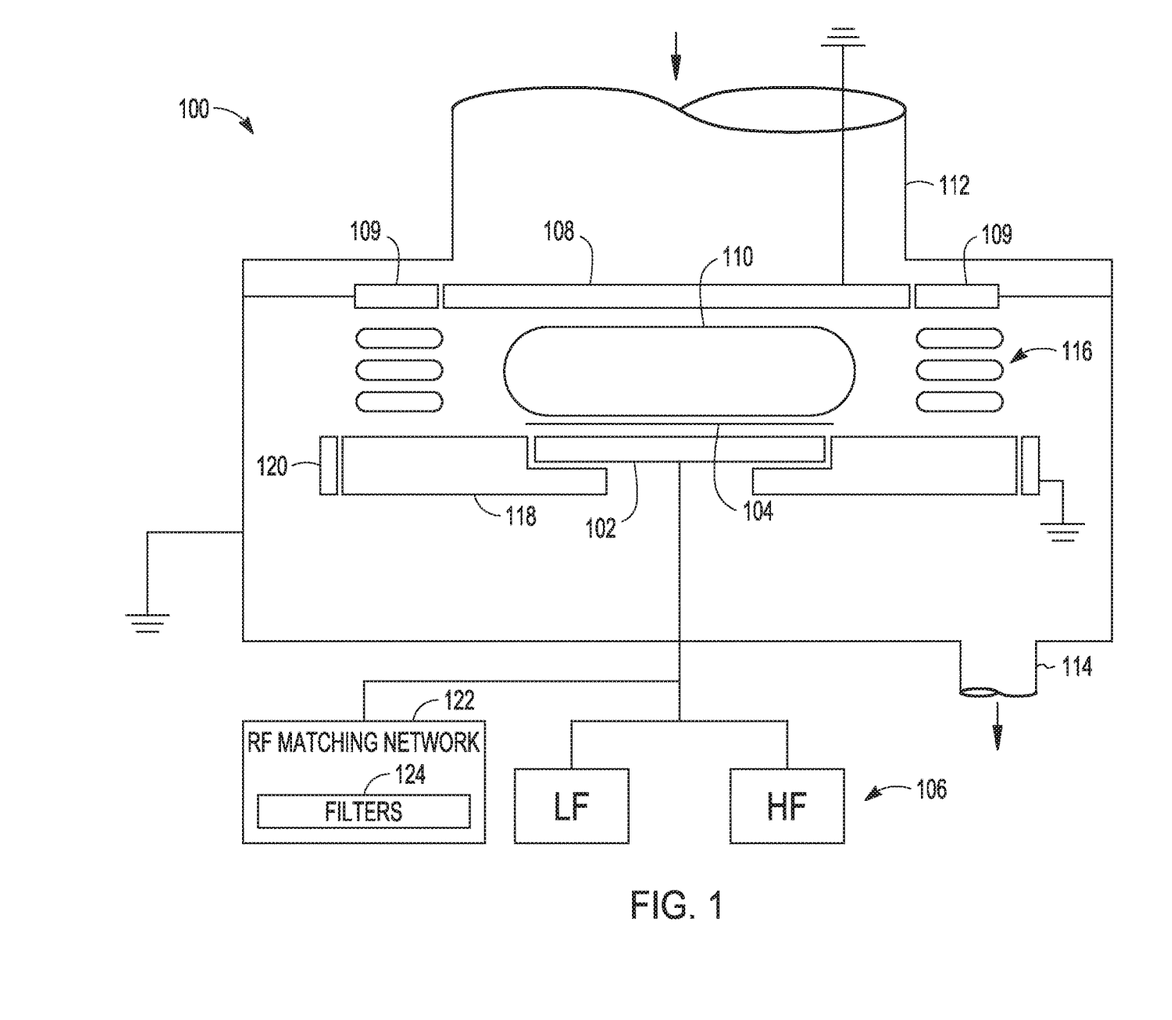
FIG. 1 is a schematic diagram of a reaction chamber within which some examples of the methods of the present disclosure may be employed, according to some examples.

Some embodiments of a variable inductor device may be used in micromechanical or printed circuit board (PCB) applications and circuits for use therewith. Other examples may be used in systems and methods for tuning an impedance matching network in semiconductor manufacturing. In this regard, reference is now made to FIG. 1 of the accompanying drawings. An example chamber in which some examples of the present disclosure may be employed, with appropriate chamber modifications for film deposition and control testing, is shown in FIG. 1 of the accompanying drawings. A typical plasma etching (or deposition) apparatus comprises a reactor in which there is a chamber through which reactive gas or gases flow. Within the chamber, the gases are ionized into a plasma, typically by radio frequency energy. The highly reactive ions of the plasma gas can react with material, such as a polymer mask on a surface of a semi-conductor wafer being processed into integrated circuits (IC's). Prior to etching, the wafer is placed in the chamber and held in proper position by a chuck or holder which exposes a top surface of the wafer to the plasma gas. There are several types of chucks known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present methods are applicable to any type of chuck.

FIG. 1 illustrates a plasma processing chamber 100, representing an exemplary plasma processing chamber of the types typically employed to etch a substrate. Referring now to FIG. 1, a chuck 102, represents a workpiece holder on which a substrate, such as a wafer 104, is positioned during etching or deposition. The chuck 102 may be implemented by any suitable chucking technique, e.g., electrostatic, mechanical, clamping, vacuum, or the like. During etching or deposition, the chuck 102 is typically supplied with dual RF frequencies (a low frequency (LF) and high frequency (HF)), for example 2 MHz and 27 MHz, simultaneously, during etching or deposition by a dual frequency source 106. A vacuum transfer module (VTM) (not shown) may be used to place and center the wafer 104 on the chuck 102. In some examples, a VTM includes one or more robotic controls or arms to manipulate the wafer 104 as it is placed on the chuck 102.

Referring again to FIG. 1, an upper electrode 108 is located above the wafer 104. The upper electrode 108 is grounded. FIG. 1 illustrates an etching reactor where the surface of the upper electrode 108 is larger than the surface of the chuck 102 and the wafer 104. During etching, plasma 110 is formed from etchant source gas supplied via a gas line 112 and pumped out through an exhaust line 114. An electrical insulator ring 109 insulates the upper electrode 108 from the processing chamber 100.

Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from RF power source 106, equipotential field lines are set up over wafer 104. The equipotential field lines are the electric field lines across the plasma sheath that is between wafer 104 and the plasma 110. In some examples, the equipotential surfaces and electric field lines are normal to each other. There are equipotential surfaces between the wafer 104 and the plasma 110. The electric field lines accelerate charged particles across these equipotential surfaces. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, an edge (or focus) ring 118 is typically provided to improve process uniformity across the entire wafer surface. With reference to FIG. 1, the wafer 104 is shown disposed within an edge ring 118, which may be formed of a suitable dielectric material such as ceramic, quartz, plastic, or the like. Thus, the presence of the edge ring 118 allows the equipotential field lines to be disposed substantially uniformly over the entire surface of the wafer 104.

An electrically conductive shield 120 substantially encircles the focus ring 118. The electrically conductive shield 120 is configured to be substantially grounded within the plasma processing chamber 100. The shield 120 prevents the presence of unwanted equipotential field lines outside of the edge ring 118.

An RF matching network 122 is associated with an RF power source 106. The RF matching network may be used to tune the RF power network supplying the plasma processing chamber 100. To configure the RF matching network 122 and tune it appropriately, the RF matching network 122 may include one or more filters 124. The filters may include inductors, capacitors and resistors, for example. Other devices are possible. One or more variable inductor devices of the present disclosure may be included in the filters 124.

As mentioned above, there are challenges in developing tuning systems. Current technology for making a tunable inductor may include the use of a variometer, but these variometers are not useful at high frequencies or low inductances. Other approaches include a movable slug made of metal or magnetic material disposed in an inductor coil. These device types have a very narrow tuning range and are prone to overheating at high current levels. A saturable magnetic material in an inductor coil can be biased by a magnetic field or another winding on the circuit to alter the inductance, but these inductors are also subject to overheating at high current levels. They can also suffer from large temperature coefficients and poor thermal stability.

Some embodiments of a variable inductor device of the present disclosure may serve as a tunable element in a network or circuit, and in some examples as a high-power capable tunable inductor. Some examples of the variable inductor device do not include magnetic material and therefore have a reduced temperature sensitivity. Device-to-device unit variability may in some cases be determined only by geometry and manufacturing tolerances. For PCB-manufactured examples, while it is possible that inherent variances in properties of the dielectric material may have some impact on overall device inductance, this issue can be addressed by utilizing high-quality low-variance dielectric material as appropriate in such applications.

In some examples described further below, the inductance variability (tunability, or inductance change) of a variable inductor device ranges from a minimum value to a maximum value that is several times higher than the base (or minimum) value. Some examples provide a tunable inductor which can operate substantially independently of other components in an RF matching network (e.g. RF matching network 122 above) without affecting other network parameters. Examples can be manufactured using low-cost PCB based techniques to avoid the expense of utilizing vacuum variable capacitors in an RF matching network 122, for example.

Figure 2A:
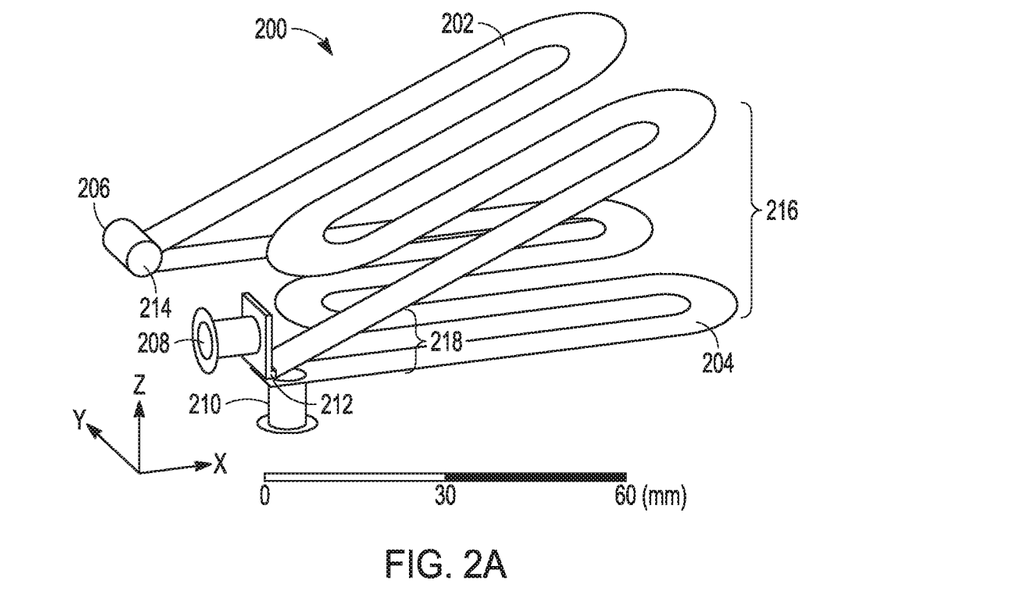
FIGS. 2A-2B are pictorial views of a variable inductor device in respective open and closed configurations, according to an example embodiment.
Figure 2B:
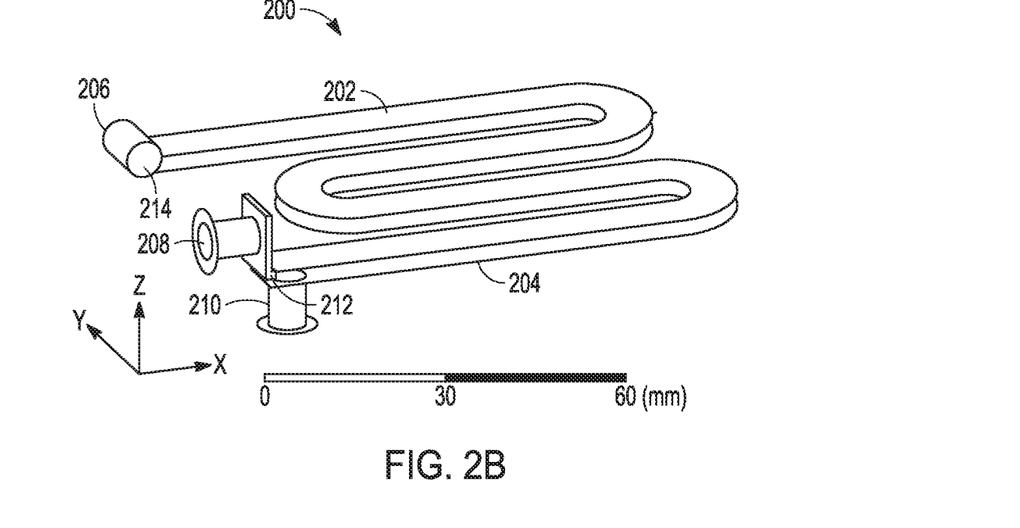

An example of a variable inductor device 200 is shown in FIGS. 2A-2B. FIG. 2A depicts an open configuration of the device 200. FIG. 2B depicts a closed configuration of the device 200. A scale between 0 and 60 mm is shown in FIGS. 2A and 2B, respectively. XYZ Coordinates axes are shown in FIGS. 2A and 2B. The device includes two loops 202 and 204. The loops 202 and 204 have planar faces or portions. In that sense, the variable inductor device may be considered a form of "parallel plate" transmission line, but this parallel configuration is generally adopted only when the device 200 is in a closed configuration, discussed further below. The loops 202 and 204 are connected (shorted) at a termination point 206. RF power may be supplied to the connected loops 202 and 204 at terminals 208 and 210. Each loop 202 and 204 lies in a plane and may assume a generally serpentine shape as shown. Other loop shapes and configurations are possible, for example as shown in the relatively tight or open bends of the example loops 202 (or 204) shown in FIGS. 3A-3B.

Figure 3A:
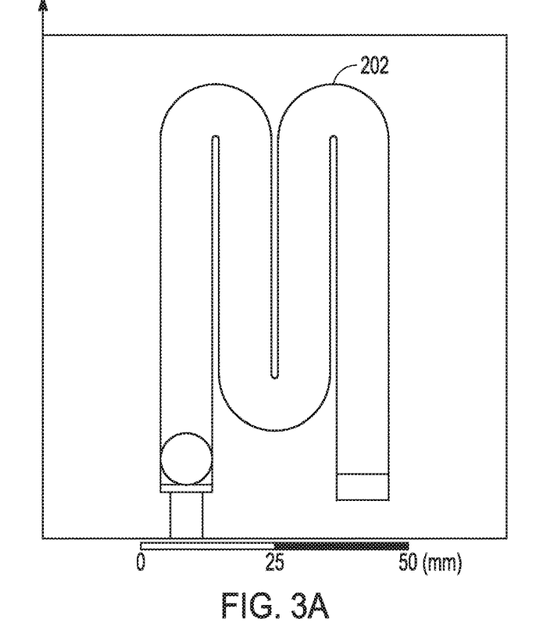
FIGS. 3A-3B depict plan views of planar loops, according to example embodiments.

In some examples, the loops 202 and 204 of the device 200 are selectively adjustable (openable, or pivotable about a hinge point) away from one another in a range of open and closed positions to vary the inductance of the device 200, as is explained more fully below. In the illustrated example, the planes of the loops 202 and 204 are spaced apart from one another by a separation angle 218. Depending on a given length (also termed a wire length) or configuration of a loop 202 or 204, a selected degree of separation angle 218 provides an associated or proportional gap 216 at the distal ends of the loops as shown in FIG. 3A. Other separation angles 218 and gaps 216 are possible and these may be selected, in fixed or variable configurations, based on a desired inductance characteristic or tunability of the variable inductor device 200 in use. The variable inductor device 200 may be adjusted in this manner to vary its inductance and thereby assist in tuning an RF matching network 122 as shown in FIG. 1, for example. Other network tuning or circuit applications are possible, some at a micro-mechanical level. Generally speaking, the degree of inductance of the device 200 is proportional, either as a linear or direct ratio or otherwise, to the angle of separation 218 between the loops 202 and 204, i.e. generally, the greater the angle, the higher the inductance.

In some examples of the device 200, the loops 202 and 204 are hinged at hinge points 212 and 214. For example, the loops 202 and 204 may be hinged to each other at a common hinge point or be hinged individually at respective separate fixtures. One loop 202 or 204 may be held stationary with respect to a datum or fixture, with the other loop movable, or both loops may be movable. The hinge points 212 and 214 may be defined by rotatable or foldable hinges provided at ends of the connected loops. The rotatable or foldable hinges may be configured as shown, but other configurations are possible. In the illustrated example, the hinge points 212 and 214 are provided respectively at closed, connected ends of the loops 202 and 204. The termination point 206 may be coincident with or located with one of the hinge points, for example at the hinge point 214. The RF power terminals 208 or 210 may be coincident with or located at a hinge point, for example the hinge point 212. In other examples, a hinge point may be provided at alternate locations along a loop, for example at an end of a serpentine bend or other location. Some portions of a loop may not be movable with respect to another portion of a loop, for example. Portions of two loops may be held closed, while other portions can be moved away from each other, for example.

A rotatable or foldable nature of the device hinges may allow a separation angle to be formed and grow (and a space to be formed between the loops 202 and 204) without deforming loop or hinge material, as may occur through bending the loops into a spaced configuration, for example. The hinge or loop material of the variable inductor device 200 is therefore held immune from metal fatigue. Furthermore, a low-friction hinge can facilitate smoothly continuous or precise incremental adjustments of the angle of separation 218 (and spaced gap 216) under guidance of a separation actuator, for example.

Figure 3B:
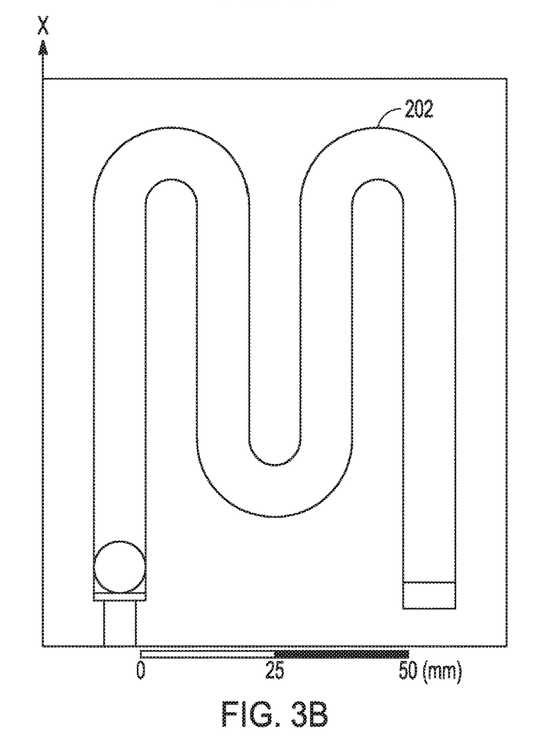

A scale between 0 and 50 mm is shown in FIGS. 3A and 3B, respectively. In some examples of the variable inductor device 200, at least a portion of the loops 202 and 204 overlap each other when the device 200 is in a closed configuration. For example, in the closed configuration of the device 200 shown in FIG. 2B, the loops 202 and 204 overlap substantially completely. The profile, size and configuration of each loop (in this example they are of similar serpentine configuration) is selected to cause the loops to overlie each other completely when closed. In some examples, only one or some portions of a loop may overlie another portion of an opposed loop when the device 200 is closed. Such partial loop overlap may occur when respective loops of a device 200 include turns of an opposite hand, for example, or when one loop has a different shape to another. The opposed or matching configuration of partially or completely overlapping loops 202 and 204 of the variable inductor device is believed to cause a more predictable and configurable response from a device 200 during variation of inductance in use. This may be due, in some examples, to the fact that only one spatial parameter (not multiple) of the spaced loops is changed during separation angle adjustment. For a given point along the length of a loop, the separation angle proportionally and predictably affects the inter-face spacing between opposed faces of the loops 202 and 204 as they draw apart or close together.

An x-axis is shown in FIGS. 3A and 3B, respectively. In some examples, the configuration and stability of the hinges can endow a device 200 with highly repeatable inductance values at open and closed positions of the loops 202 and 204 (i.e. in open and closed configurations of the device 200) and great device-to-device consistency. In testing, loops 202 and 204 of an example device 200 were opened and closed many times by an actuator with a one-second delay at each position. The tested device 200 was repeatedly opened and closed sixteen thousand (1600) times. The average measured device 200 inductance when closed was 42.52+/−0.29 nH (i.e. a variation in accuracy of only 0.68%). The average measured device 200 inductance when open was 109.69+/−0.17 nH (i.e. a variation in accuracy of only 0.15%).

Figure 4:
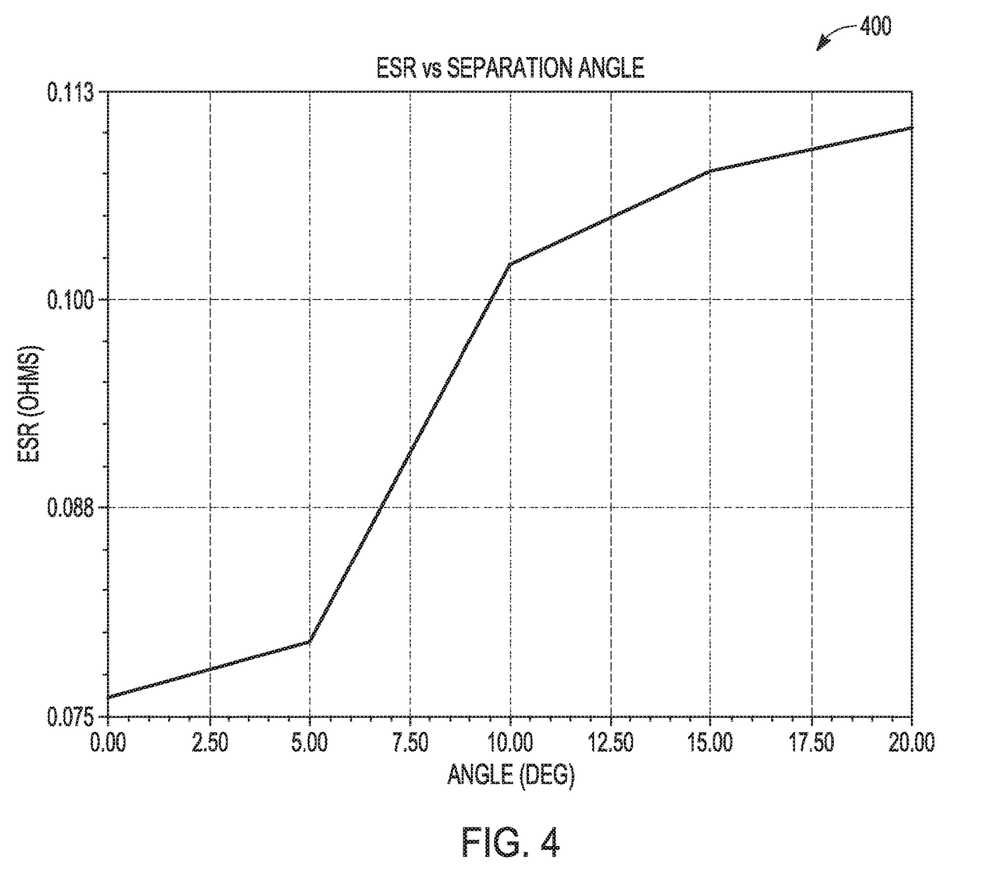
FIG. 4 depicts a graph of Equivalent Series Resistance (ESR) values against separation angle, according to an example embodiment.
Figure 5:
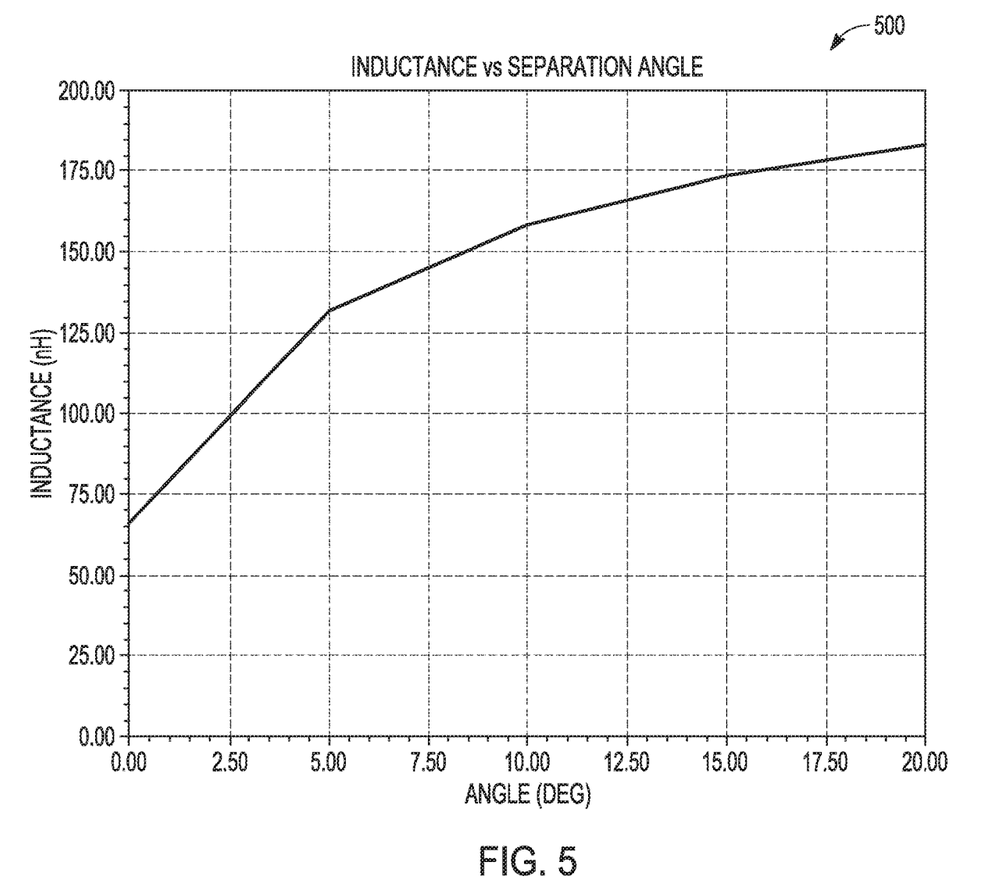
FIG. 5 depicts a graph of inductance values against separation angle, according to an example embodiment.
Figure 7:
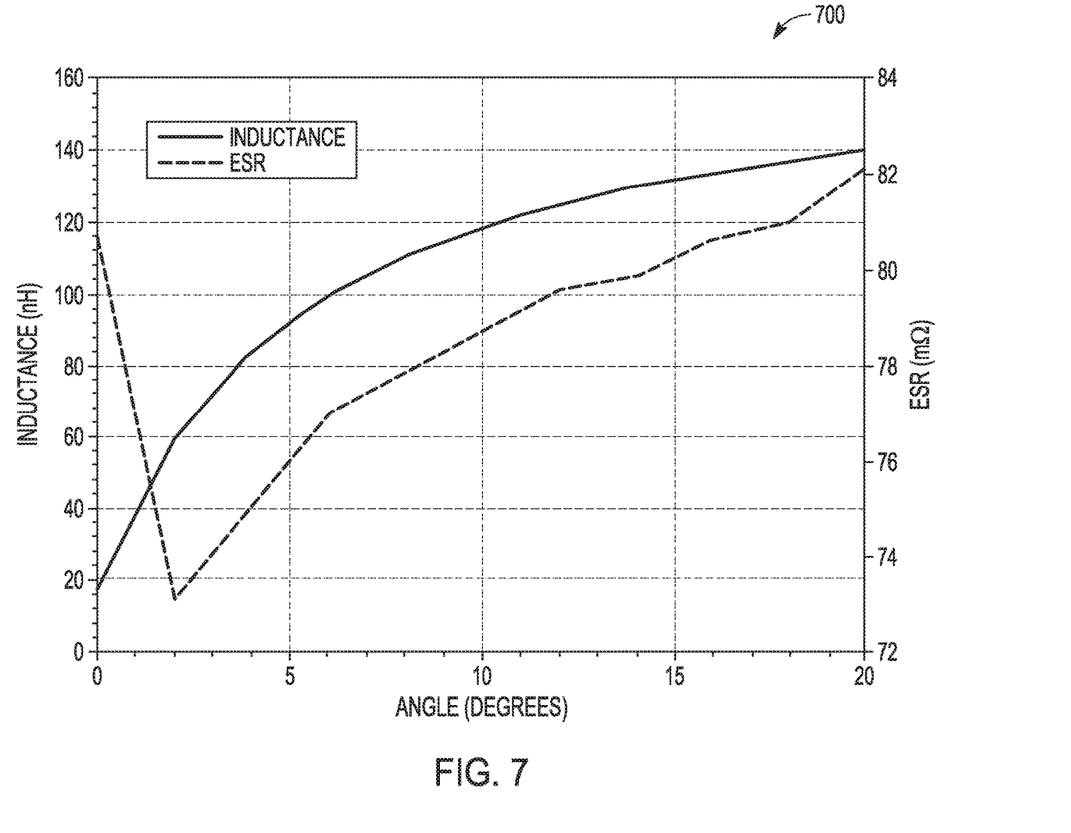
FIG. 7 depicts a graph of ESR and inductance values against separation angle, according to an example embodiment.
Figure 8:
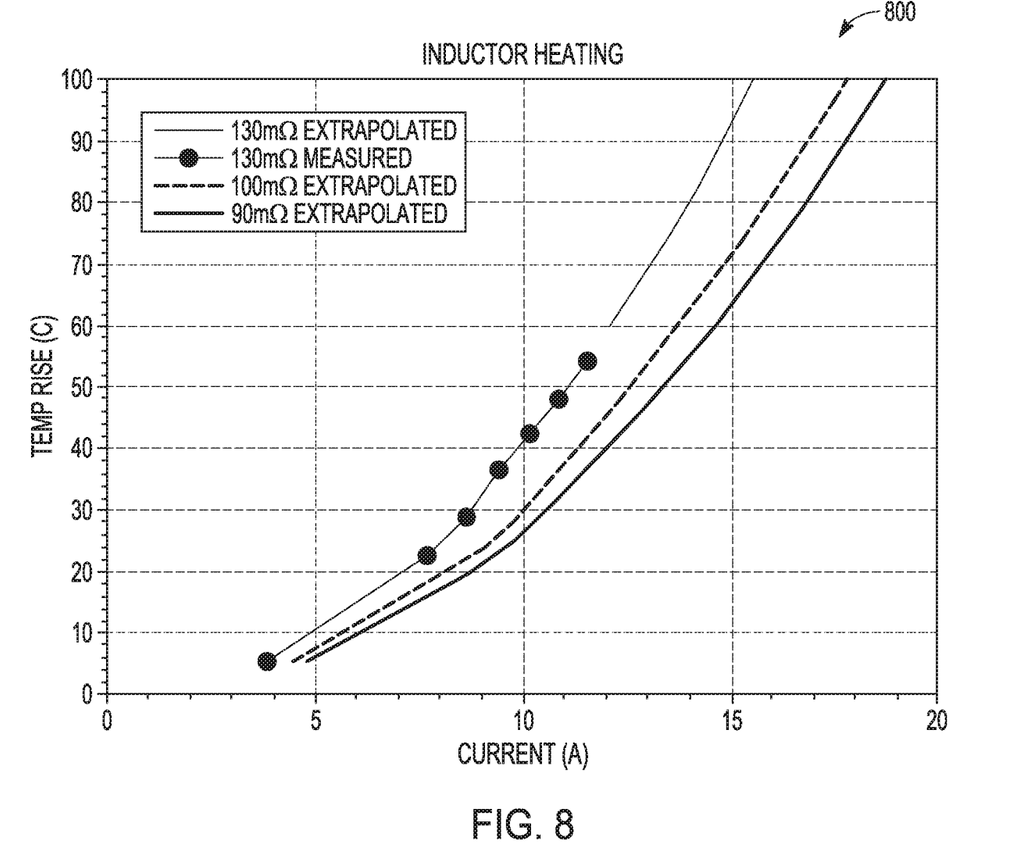
FIG. 8 depicts a graph of inductor heating against current, according to an example embodiment.

OHMS in FIG. 4 refers to ohms ($\Omega$), DEG in FIGS. 4, 5, and 7 refer to degrees, nH in FIGS. 5 and 7 refer to nanoHenry, m$\Omega$ in FIG. 7 refers to milliohms, A in FIG. 8 refers to Amp, and C in FIG. 8 refers to degrees Celsius. Regarding response characteristics and tuning capability of an example variable inductor device 200, reference is now made to FIGS. 4-5 of the accompanying drawings. For an example variable inductor device 200, FIG. 4 shows a graph 400 with ESR values in ohms of the device on the y-axis plotted against a separation angle in degrees 218 of the loops 202 and 204 on the x-axis. Here, as shown, the separation angle 218 runs from zero (0.00) to twenty (20.00) degrees. Corresponding ESR values as the separation angle range from approximately 0.075 to 0.113 Ohms. The increase in resistance is therefore relatively small. The graph 500 in FIG. 5 however shows a much greater range of change in inductance in nH as the separation 218 angle in degrees increases. A much greater change in inductance may be observed for the same range of separation angles (zero to twenty degrees), in this instance a change from approximately 65 to 185 nH.

Figure 6:
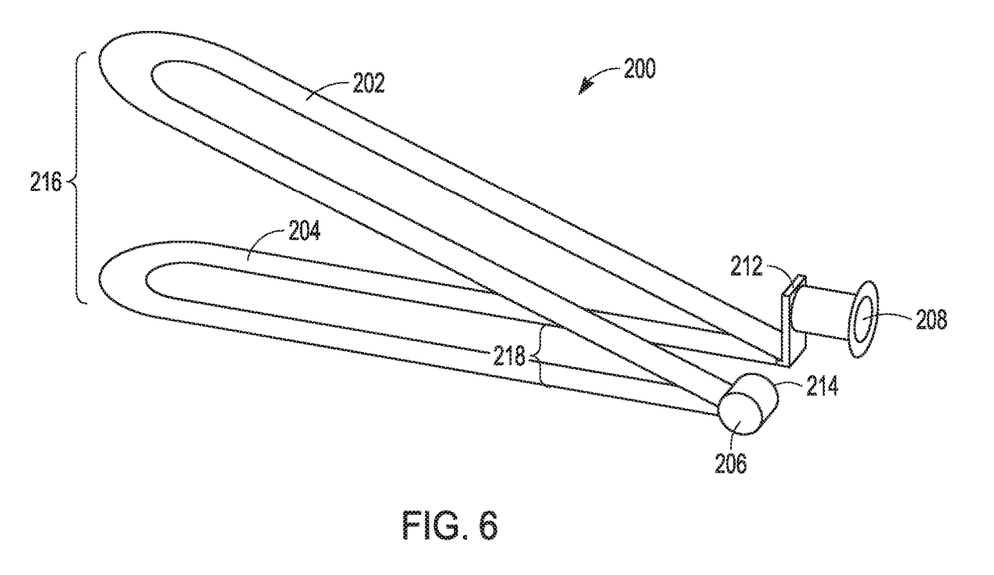
FIG. 6 is a pictorial view of a variable inductor device, according to an example embodiment.

A further example configuration of a variable inductor device 200 is shown in FIG. 6. The aspect ratio of the loops 202 and 204 is higher than the corresponding aspect ratio of the loops 202 and 204 in the example devices discussed above. The components 206, 208, 212, 214, 216, and 218 shown in FIG. 6 refer to the same components as discussed above unless stated otherwise. For this example, a graph 700 of ESR in m$\Omega$ and inductance values in nH against separation angle in degrees is shown in FIG. 7. The ESR values shown on the right of the graph range from approximately 74 to 82 mOhms (m$\Omega$) (i.e. a delta of 8 m$\Omega$) over a separation angle ranging from zero (0) to twenty (20) degrees. On the other hand, over the same range of separation angle adjustment, the inductance of the device 200 increased from a base value of approximately 20 nH to a maximum value of 140 nH at a separation angle of twenty (20) degrees. This maximum value represents a seven-fold increase in inductance over the base value. The high degree of inductance variability may endow an RF matching network 122 (FIG. 1) with a correspondingly high degree of tuning capability. For a given device 200, the relatively high range of change in inductance against a minimal change in resistance over the same range of separation angle variation can be contrasted with the drawbacks in conventional methods of trying to balance and compromise between competing L, C and R network parameters discussed further above.

Some examples of a variable inductor device are resilient and are configured to handle the application of high powers and frequencies by an RF power source to a processing chamber. Typically, a high current generated by an RF power source 106 (FIG. 1) is in the order of fifteen Amps (A). With reference to FIG. 8, the illustrated graph 800 indicates that measured and modelled devices 200 were able to handle current values in A well in excess of 15A, albeit with some degree of temperature rise in C (e.g. at 130 mΩ, 100 mΩ, 90 mΩ as shown.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A variable inductor device including:
   a first planar loop comprising a first planar face;
   a second planar loop comprising a second planar face;
   the first planar loop separable from the second planar loop to vary an inductance of the variable inductor device;
   the first and second planar faces overlapping each other in a closed configuration of the variable inductor device, and
   a hinge at which one of the first and second planar loops is hinged relative to the other one of the first and second planar loops,
   wherein the hinge is provided at a termination point of the first and second planar loops and/or,
   wherein the hinge is provided at an RF power terminal of the variable inductor device.

2. The variable inductor device of claim 1, wherein the first planar loop is separable from the second planar loop by pivoting about the hinge.

3. The variable inductor device of claim 1, wherein the first and second planar loops are selectively separable with respect to one another between open and closed positions, the closed position corresponding to the closed configuration of the device, the open position corresponding to a desired inductance value of the variable inductor device.

4. The variable inductor device of claim 3, wherein the open and closed positions correspond to a separation angle between the first and second planar loops in the range zero (0) to twenty (20) degrees.

5. The variable inductor device of claim 1, wherein substantially an entirety of the first planar loop overlaps the second planar loop in the closed configuration of the device.

6. The variable inductor device of claim 5, wherein substantially an entirety of the first planar loop overlaps substantially an entirety of the second planar loop in the closed configuration of the device.

7. The variable inductor device of claim 1, wherein each of the first and second planar loops assumes a serpentine shape.

8. The variable inductor device of claim 1, wherein an open configuration of the variable inductor device corresponds to a maximum inductance value of the variable inductor device.

9. The variable inductor device of claim 8, wherein the maximum inductance value is greater than the base or minimum inductance value by a factor of three (3) to seven (7) times greater.

10. The variable inductor device of claim 1, wherein the closed configuration of the variable inductor device corresponds to a base or minimum inductance value of the variable inductor device.

11. A variable inductor device including:
    a first planar loop comprising a first planar face;
    a second planar loop comprising a second planar face;
    a first hinge;
    a second hinge;
    a first end of the first planar loop and a first end of the second planar loop being connected by the first hinge, the second end of the first planar loop and the second end of the second planar loop being connected by the second hinge;
    the first planar loop separable from the second planar loop by pivoting about the first hinge and the second hinge to vary an inductance of the variable inductor device,
    the second end of the first planar loop having a first RF power terminal; and/or
    the second end of the second planar loop having a second RF power terminal.

12. The variable inductor device of claim 11, wherein a closed configuration of the variable inductor device corresponds to a base or minimum inductance value of the variable inductor device.

13. The variable inductor device of claim 12, wherein an open configuration of the variable inductor device corresponds to a maximum inductance value of the variable inductor device.

14. The variable inductor device of claim 13, wherein the maximum inductance value is greater than the base or minimum inductance value by a factor of three (3) to seven (7) times greater.

15. The variable inductor device of claim 11, wherein the first and second planar faces overlap each other in a closed configuration of the device.

16. The variable inductor device of claim 15, wherein the first and second planar loops are selectively separable with respect to one another between open and closed positions, the closed position corresponding to the closed configuration of the device, the open position corresponding to a desired inductance value of the variable inductor device.

17. The variable inductor device of claim 16, wherein substantially an entirety of the first planar loop overlaps the second planar loop in the closed position.

18. The variable inductor device of claim 17, wherein substantially an entirety of the first planar loop overlaps substantially an entirety of the second planar loop in the closed position.

19. The variable inductor device of claim 16, wherein the open and closed positions correspond to a separation angle between the first and second planar loops in the range zero (0) to twenty (20) degrees.

20. The variable inductor device of claim 1 or claim 11, further comprising an actuator to move at least one of the first and second planar loops.

\* \* \* \* \*